(12) United States Patent
Jo (10) Patent No.: US 10,032,504 B2
(45) Date of Patent: Jul. 24, 2018

(54) SEMICONDUCTOR MEMORY DEVICE AND OPERATING METHOD THEREOF

(71) Applicant: SK hynix Inc., Gyeonggi-do (KR)

(72) Inventor: Mi-Hyeon Jo, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/587,486

(22) Filed: May 5, 2017

(65) Prior Publication Data

US 2018/0061479 A1 Mar. 1, 2018

(30) Foreign Application Priority Data

Aug. 25, 2016 (KR) .................. 10-2016-0108279

(51) Int. Cl.
| | |
|---|---|
| *G11C 8/10* | (2006.01) |
| *G11C 11/4094* | (2006.01) |
| *G11C 11/4091* | (2006.01) |
| *G11C 11/4074* | (2006.01) |
| *G11C 11/4076* | (2006.01) |
| *G11C 11/406* | (2006.01) |
| *G11C 8/08* | (2006.01) |
| *G11C 8/12* | (2006.01) |

(52) U.S. Cl.
CPC ........ *G11C 11/4094* (2013.01); *G11C 11/406* (2013.01); *G11C 11/4074* (2013.01); *G11C 11/4076* (2013.01); *G11C 11/4091* (2013.01); *G11C 8/08* (2013.01); *G11C 8/10* (2013.01); *G11C 8/12* (2013.01)

(58) Field of Classification Search
CPC ................ G11C 8/10; G11C 8/08; G11C 8/12
USPC ....................................... 365/230.06
See application file for complete search history.

(56) References Cited

U.S. PATENT DOCUMENTS 5,773,999 A * 6/1998 Park ................. G11C 7/1051
326/27
7,813,200 B2 * 10/2010 Seo ................. G11C 11/4091
365/194

FOREIGN PATENT DOCUMENTS

KR 1020100107346 10/2010

* cited by examiner

*Primary Examiner* — Jason Lappas
(74) *Attorney, Agent, or Firm* — IP & T Group LLP (57) ABSTRACT

A semiconductor memory device may include a sense amplifier for sensing and amplifying data of a bit line pair with pull-up and pull-down driving voltages; a voltage supplier for supplying a power supply voltage or an internal voltage lower than the power supply voltage as the pull-up driving voltage through a pull-up power supply line in response to a first or second pull-up control signal, and supplying a ground voltage as the pull-down driving voltage through a pull-down power supply line in response to a pull-down control signal; a voltage detector for detecting a voltage level of the power supply voltage and outputting a detection signal; and a control signal generator for generating the first and second pull-up control signals, and the pull-down control signal and delaying an enabling timing of one of the first pull-up and pull-down control signals in response to the detection signal.

9 Claims, 6 Drawing Sheets

SEMICONDUCTOR MEMORY DEVICE AND OPERATING METHOD THEREOF

CROSS-REFERENCE TO RELATED APPLICATIONS

The present application claims priority under 35 U.S.C. 119(a) to Korean Patent Application No. 10-2016-0108279, filed on Aug. 25, 2016, which is incorporated herein by reference in its entirety.

BACKGROUND

1. Field

Exemplary embodiments of the present invention relate to a semiconductor design technology, and more particularly, to a semiconductor memory device capable of performing a refresh operation.

2. Description of the Related Art

A semiconductor memory device, such as a dynamic random access memory (DRAM), generally includes a plurality of memory cells. Each memory cell may typically include a transistor that serves as a switch and a capacitor that stores charges, that is, data. A memory cell is determined to have stored data in a logic 'high' level (a logic value of '1') or a logic 'low' level (a logic value of '0') based on whether there are charges in a capacitor thereof, that is, whether the terminal voltage of the capacitor is high or low.

Data are retained in a form as charges that are accumulated in a capacitor. Therefore, ideally, there should be no power consumption to retain data. However, since current leaks due to a PN junction of a transistor, the initial amount of charges that are stored in a capacitor may decrease, thereby causing data loss. To prevent this data loss, data in a memory cell should be read before the data is lost, and then the memory cell should be re-charged to keep the original amount of charges based on the information which was read. This operation should be performed periodically to retain the data. The operation of re-charging the memory cell is called "a refresh operation".

The refresh operation is carried out each time a refresh command is inputted from a memory controller to a memory. The memory controller transmits the refresh command to the memory at predetermined time intervals in consideration of a data retention time of the memory. For example, when a data retention time of a memory is approximately 64 ms all the memory cells in the memory may be able to be refreshed only after a refresh command is received approximately 8000 times. That is, the memory controller may transmit the refresh command into the memory device approximately 8000 times within approximately 64 ms.

When the refresh command is received, the memory sequentially enters an active mode and a precharge mode to perform a refresh operation. When a memory cell is selected during the active mode, a bit-line sense amplifier or amplifying circuit of the memory is enabled to sense and amplify a data transferred from the selected memory cell and then send the data back into the memory cell. The memory cell is deselected during the precharge mode, and the bit-line sense amplifier is disabled so that the memory cell retains the data stored therein.

Therefore, optimizing the performance of the bit-line sense amplifier to perform a refresh operation efficiently is necessary.

SUMMARY

Embodiments of the present invention are directed to a voltage supplying circuit that may adjust the timing of supplying driving voltages to a bit-line sense amplifier by sensing the voltage level of an external power supply voltage, a semiconductor memory device including the voltage supplying circuit, and an operating method of the semiconductor memory device.

In accordance with an embodiment of the present invention, a semiconductor memory device may include: a sense amplifier suitable for sensing and amplifying data of a bit line pair with a pull-up driving voltage and a pull-down driving voltage; a voltage supplier suitable for supplying a power supply voltage or an internal voltage lower than the power supply voltage as the pull-up driving voltage through a pull-up power supply line in response to a first pull-up control signal or a second pull-up control signal, and supplying a ground voltage as the pull-down driving voltage through a pull-down power sup ply line in response to a pull-down control signal; a voltage detector suitable for detecting a voltage level of the power supply voltage and outputting a detection signal; and a control signal generator suitable for generating the first and second pull-up control signals and the pull-down control signal in response to an active signal and a precharge signal, and delaying an enabling timing of one of the first pull-up control signal and the pull-down control signal in response to the detection signal.

In accordance with another embodiment of the present invention, a voltage supplying circuit may include: a first pull-up driving unit suitable for supplying a power supply voltage as a pull-up driving voltage through a pull-up power supply line in response to a first pull-up control signal; a second pull-up driving unit suitable for supplying an internal voltage lower than the power supply voltage as the pull-up driving voltage through the pull-up power supply line in response to a second pull-up control signal; a pull-down driving unit suitable for supplying a ground voltage as a pull-down driving voltage through a pull-down power supply line in response to a pull-down control signal; and a control signal generation unit suitable for generating the first pull-up control signal, the second pull-up control signal, and the pull-down control signal and delaying an enabling timing of one of the first pull-up control signal and the pull-down control signal in response to a detection signal that is enabled when the voltage level of the power supply voltage reaches a predetermined level.

In accordance with yet another embodiment of the present invention, an operating method of a semiconductor memory device may include: generating a first pull-up control signal, a second pull-up control signal, and a pull-down control signal in response to an active signal and a precharge signal, by delaying an enabling timing of the first pull-up control signal based on a voltage level of a power supply voltage; supplying the power supply voltage through a pull-up power supply line in response to the first pull-up control signal, supplying an internal voltage lower than the power supply voltage through the pull-up power supply line in response to the second pull-up control signal, and supplying a ground voltage through a pull-down power supply line in response to the pull-down control signal; and sensing and amplifying data of a bit line pair with a pull-up driving voltage that is supplied through the pull-up power supply line and a pull-down driving voltage that is supplied through the pull-down power supply line.

DETAILED DESCRIPTION

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements. As used herein the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and should not be interpreted in an idealized or overly formal sense unless expressly so defined herein.

Additionally, in the following description, numerous specific details are set forth that provide a thorough description of the present invention. However, as would be apparent to those skilled in the relevant art, the present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

A semiconductor memory device generates and uses an internal voltage of a required voltage level based on an external power supply voltage VDD. For example, a memory device using a bit-line sense amplifier, such as a dynamic random access memory (DRAM) uses a core voltage VCORE as an internal voltage to amplify a cell data.

When a word line is activated, data of a plurality of memory cells that are coupled to the activated word line may be transferred to pairs of bit lines. A bit-line sense amplifier then may sense and amplify the voltage difference between each pair of bit lines. Generally, a bit-line sense amplifier performs an amplification operation by using a pull-up driving voltage and a pull-down driving voltage that are supplied through a pull-up power supply line RTO and a pull-down power supply line SB. Herein, the pull-up driving voltage may be set at the voltage level of a core voltage VCORE, which is the internal voltage of a memory device, and the pull-down driving voltage may be set at the voltage level of a ground voltage VSS.

Performed recently is an over-driving operation that may shorten the time for amplification operation of a bit-line sense amplifier by supplying a voltage higher than a core voltage VCORE for example, an external power supply voltage VDD to a pull-up power supply line RTO during the initial operation of the bit-line sense amplifier right after charges are shared between a memory cell and a pair of bit lines.

Figure 1:
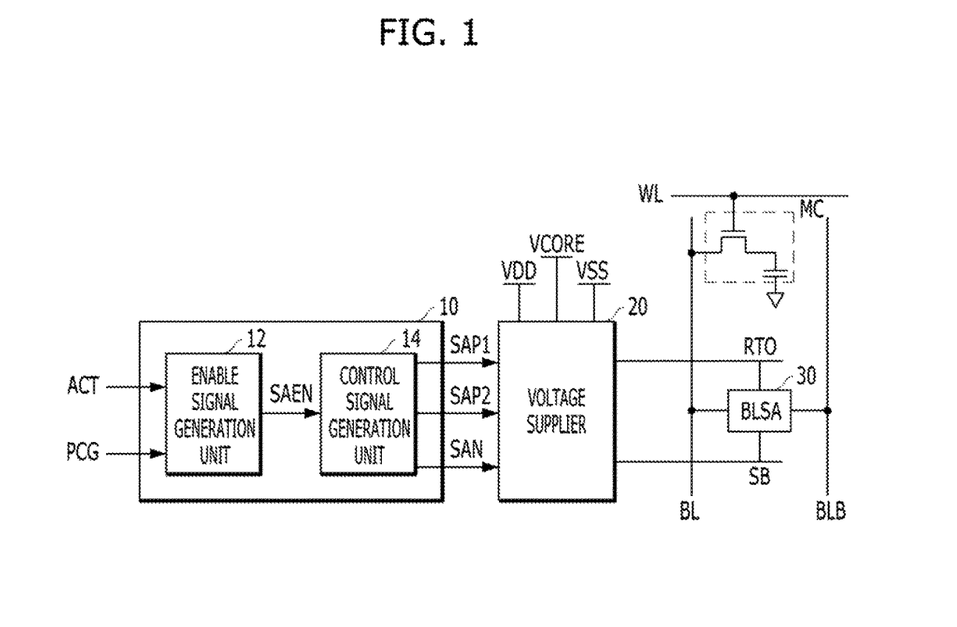
FIG. 1 is a block diagram illustrating a semiconductor memory device performing an over-driving operation.

FIG. 1 is a block diagram illustrating a semiconductor memory device performing an over-driving operation.

Referring to FIG. 1, the semiconductor memory device may include a control signal generator 10, a voltage supplier 20, and a bit-line sense amplifier (BLSA) 30.

The bit-line sense amplifier 30 may sense and amplify the data of a bit line pair BL and BLB with a pull-up driving voltage and a pull-down driving voltage that are respectively supplied through a pull-up power supply line RTO and a pull-down power supply line SB. When a word line WL is activated, the data stored in a memory cell MC that is coupled to the activated word line may be transferred to a bit line BL. The bit-line sense amplifier 30 may sense and amplify the data of the memory cell MC that is transferred through the bit line BL.

The voltage supplier 20 may supply a pull-up driving voltage through the pull-up power supply line RTO in response to a first pull-up control signal SAP1 and a second pull-up control signal SAP2, and may supply a pull-down driving voltage through the pull-down power supply line SB in response to a pull-down control signal SAN. The voltage supplier 20 may supply the pull-up driving voltage at the voltage level of the external power supply voltage VDD in response to the first pull-up control signal SAP1, and supply the pull-up driving voltage at the voltage level of the core voltage VCORE in response to the second pull-up control signal SAP2. Also, the voltage supplier 20 may supply the pull-down driving voltage at the voltage level of the ground voltage VSS in response to the pull-down control signal SAN. Herein, the voltage difference of the bit line pair BL and BLB may be sensed and amplified to the voltage level of the core voltage VCORE when a logic high-level data is stored in the cell capacitor of the memory cell MC.

The control signal generator 10 may generate the first pull-up control signal SAP1, the second pull-up control signal SAP2, and the pull-down control signal SAN in response to an active signal ACT and a precharge signal PCG. Herein, the precharge signal PCG is a pulse signal that is generated internally when a precharge command is inputted to the semiconductor memory device, and the active signal ACT is a pulse signal that is generated internally when an active command is inputted thereto. The commands and the corresponding signals may be substantially the same signals.

Specifically, the control signal generator 10 may include an enable signal generation unit 12 and a control signal generation unit 14.

The enable signal generation unit 12 may generate a sense amplification enable signal SAEN which is enabled in response to the active signal ACT and disabled in response to the precharge signal PCG. The control signal generation unit 14 may generate the first pull-up control signal SAP1, the second pull-up control signal SAP2, and the pull-down control signal SAN based on the sense amplification enable signal SAEN. The control signal generation unit 14 may control the pull-down control signal SAN and the first pull-up control signal SAP1 to be enabled at the same moment in response to the enabling of the sense amplification enable signal SAEN. For example, the control signal generation unit 14 may enable the pull-down control signal SAN and the first pull-up control signal SAP1 after a time for one clock cycle (1 tCK) passes from a moment when the sense amplification enable signal SAEN is enabled.

Hereafter, an over-driving operation of the semiconductor memory device shown in FIG. 1 is described with reference to the accompanying drawing.

Figure 2:
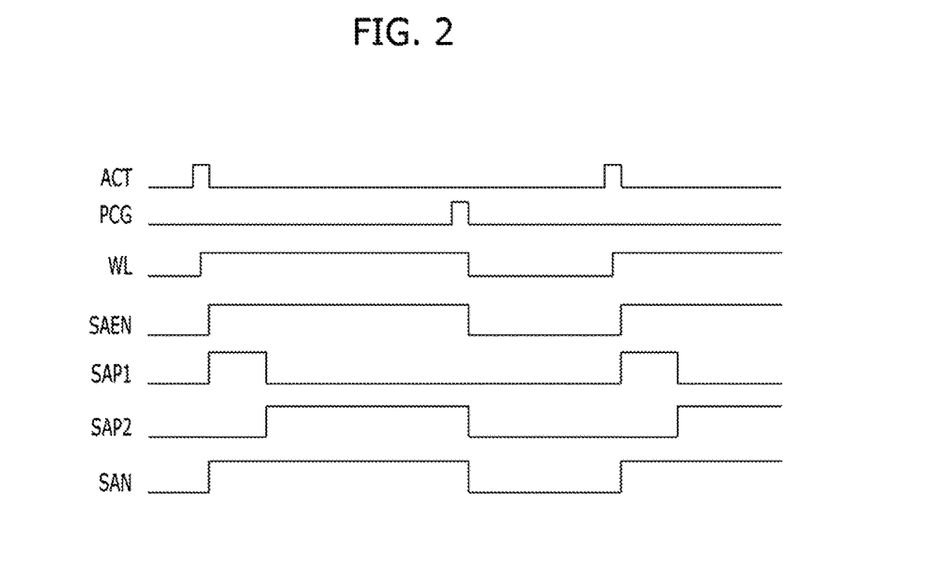
FIG. 2 is an operation waveform diagram illustrating the over-driving operation of the semiconductor memory device shown in FIG.

FIG. 2 is an operation waveform diagram for describing the over-driving operation of the semiconductor memory device shown in FIG. 1.

Before the active command is inputted to the semiconductor memory device, the bit line pair BL and BLB are precharged. Herein, a precharge voltage may be a half the voltage level of the core voltage VCORE (VCORE/2).

When the active command is inputted to enable the active signal ACT, the word line WL may be activated in response to the enabled active signal ACT and the data of the memory cell MC coupled to the activated word line WL may be transferred to the bit line BL.

Furthermore, the enable signal generation unit 12 of the control signal generator 10 may generate the sense amplification enable signal SAEN that is enabled in response to the active signal ACT and disabled in response to the precharge signal PCG. The control signal generation unit 14 may generate the pull-down control signal SAN that is enabled and maintained in an active cycle of the sense amplification enable signal SAEN, and generate the first pull-up control signal SAP1 that is enabled and maintained in a portion of the active cycle of the sense amplification enable signal SAEN. The control signal generation unit 14 may also generate the second pull-up control signal SAP2 that is enabled in response to the disabling of the first pull-up control signal. SAP1 and disabled in response to the disabling of the sense amplification enable signal SAEN.

Herein, an active cycle of the first pull-up control signal SAP1 may be a predetermined initial section of the active cycle of the sense amplification enable signal SAEN that is defined based on the active signal ACT and the precharge signal PCG. Therefore, during a predetermined initial section of an active mode, the voltage supplier 20 may supply the pull-up driving voltage at the voltage level of the external power supply voltage VDD through the pull-up power supply line RTO in response to the first pull-up control signal SAP1 and supply the pull-down driving voltage at the voltage level of the ground voltage VSS through the pull-down power supply line SB in response to the pull-down control signal SAN. The bit-line sense amplifier 30 may perform the over-driving operation by sensing and amplifying the data of the bit line pair BL and BLB with the pull-up driving voltage and the pull-down driving voltage that are respectively supplied through the pull-up power supply line RTO and the pull-down power supply line SB.

Moreover, the bit-line sense amplifier 30 may be able to accurately sense and amplify even a slight potential difference between the bit line pair BL and BLB. To accomplish this, a PMOS transistor pair (not shown) and an NMOS transistor pair (not shown) that constitute a cross-coupled latch which senses a voltage ire the bit-line sense amplifier 30 should be formed to have the same channel width/length (W/L). However, there is offset originating from mismatches in the channel W/L ratio and the threshold voltage Vth of the transistors in the bit-line sense amplifier 30. The offset may shorten the data retention time of a memory cell, and increase the refresh rate or frequency of a refresh operation. Therefore, developing a technology for decreasing the refresh rate is necessary.

Hereafter, a structure and method for optimizing the offset of a bit-line sense amplifier in accordance with an embodiment of the present invention are described with reference to the accompanying drawings.

Figure 3:
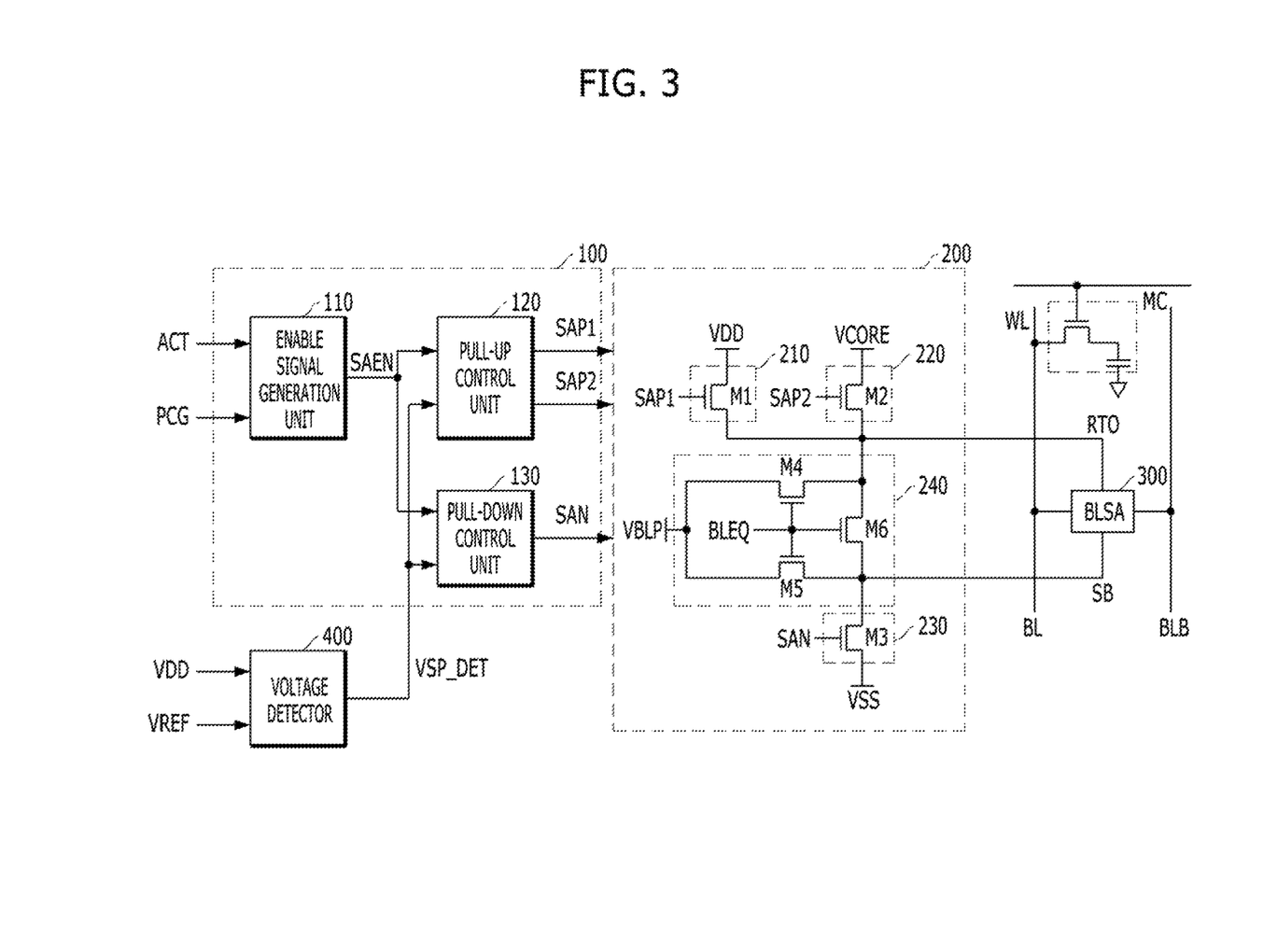
FIG. 3 is a block diagram illustrating a semiconductor memory device in accordance with an embodiment of the present invention.

FIG. 3 is a block diagram illustrating a semiconductor memory device according to an embodiment of the present invention.

Referring to FIG. 3, the semiconductor memory device may include a control signal generator 100, a voltage supplier 200, a bit-line sense amplifier 300, and a voltage detector 400.

The voltage detector 400 may detect a voltage level of a power supply voltage VDD and output a detection signal VSP_DET. For example, the voltage detector 400 may enable the detection signal VSP_DET when the voltage level of the power supply voltage VDD is equal to or higher than a reference voltage VREF, and disable the detection signal VSP_DET when the voltage level of the power supply voltage VDD is lower than the reference voltage VREF. Herein, the voltage detector 400 may sense a change in outside conditions, such as PVT (pressure, voltage, and temperature) by detecting not a core voltage VCORE that is, an internal voltage but the power supply voltage VDD that is, an external voltage.

The control signal generator 100 may generate a first pull-up control signal SAP1, a second pull-up control signal SAP2, and a pull-down control signal SAN in response to an active signal ACT and a precharge signal PCG, and delay the enabling timing of the first pull-up control signal SAP1 or the pull-down control signal SAN in response to the detection signal VSP_DET. Furthermore, although not illustrated in FIG. 3, when a refresh command is inputted, the semiconductor memory device may sequentially enter an active mode and a precharge mode to perform a refresh operation. Thus, the control signal generator 100 may generate the first pull-up control signal SAP1, the second pull-up control signal SAP2, and the pull-down control signal SAN in response to the refresh command, and delay the enabling timing of the first pull-up control signal SAP1 or the pull-down control signal SAN in response to the detection signal VSP_DET.

The pull-down control signal SAN may be enabled in response to the active signal ACT and disabled in response to the precharge signal PCG. The first pull-up control signal SAP1 may be enabled in response to the active signal ACT and may be maintained in the enabling state during a predetermined section. The second pull-up control signal SAP2 may be enabled in response to the disabling of the first pull-up control signal SAP1 and disabled in response to the precharge signal PCG. Additionally the control signal generator 100 may delay the enabling timing of the first pull-up control signal SAP1 when the detection signal VSP_DET is enabled, and delay the enabling timing of the pull-down control signal SAN when the detection signal VSP_DET is disabled. Herein, the first pull-up control signal SAP1 may be controlled to have a constant pulse width regardless of whether or not the detection signal VSP_DET is enabled.

The voltage supplier 200 may supply the power supply voltage VDD or the core voltage VCORE lower than the power supply voltage VDD, as a pull-up driving voltage through a pull-up power supply line RTO in response to the first pull-up control signal SAP1 and the second pull-up control signal SAP2, and supply a ground voltage VSS as a pull-down driving voltage through a pull-down power supply line SB in response to the pull-down control signal SAN.

The bit-line sense amplifier 300 may sense and amplify the data of a bit line pair BL and BLB with the pull-up driving voltage that is supplied through the pull-up power supply line RTO and the pull-down driving voltage that is supplied through the pull-down power supply line SB. When a word line WL is activated, a data stored in a memory cell MC that is coupled to the activated word line WL may be transferred through the bit line BL, and the bit-line sense amplifier 300 may sense and amplify the data of the memory cell MC that is transferred through the bit line BL.

The bit-line sense amplifier 300 may be an amplification circuit that is formed of a cross-coupled latch including a plurality of PMOS transistors, for example, a PMOS transistor pair, and a plurality of NMOS transistors, for example, an NMOS transistor pair. The bit-line sense amplifier 300 may sense and amplify the voltage of the bit line pair BL and BLB that is coupled to a differential input terminal thereof by using the pull-up driving voltage that is supplied through the pull-up power supply line RTO and the pull-down driving voltage that is supplied through the pull-down power supply line SB. Herein, the offset characteristics of the bit-line sense amplifier 300 may become different depending on a mismatch in the PMOS transistor pair PM1 and PM2 or the NMOS transistor pair NM1 and NM2 that forms the differential input terminal.

Generally, NMOS transistors have a smaller mismatch therebetween and a lower threshold voltage Vth than PMOS transistors. Therefore, the NMOS transistor pair NM1 and NM2 is turned on first in the initial stage of the operation of the bit-line sense amplifier 300. That is, the mismatch of the NMOS transistor pair NM1 and NM2 may become a significant factor in the offset of the bit-line sense amplifier 300 in the initial stage of the operation of the bit-line sense amplifier 300. Furthermore, when the voltage level of the power supply voltage VDD is high, which means that the voltage level of a source terminal of the PMOS transistor pair PM1 and PM2 is high, the mismatch of the PMOS transistor pair PM1 and PM2 may become a significant factor in the offset of the bit-line sense amplifier 300. Herein, since the PMOS transistor pair PM1 and PM2 has a larger mismatch than the NMOS transistor pair NM1 and NM2, the operation of the bit-line sense amplifier 300 may deteriorate more than in the initial state.

In accordance with the embodiment of the present invention, to minimize the influence of the PMOS transistor pair PM1 and PM2 when the voltage level of thee power supply voltage VDD is high, the control signal generator 100 may delay the enabling timing of the first pull-up control signal SAP1. Therefore, the voltage supplier 200 may supply the ground voltage VSS through the pull-down power supply line SB earlier than the timing of the power supply voltage VDD which is supplied through the pull-up power supply line RTO. In this manner, securing a gate-source voltage Vgs and turning-on the PMOS transistor pair PM1 and PM2 may be delayed. Therefore, the influence of the PMOS transistor pair PM1 and PM2 on the offset of the bit-line sense amplifier 300 may be minimized, thus optimizing the offset.

Specifically, the control signal generator 100 may include an enable signal generation unit 110, a pull-up control unit 120, and a pull-down control unit 130.

The enable signal generation unit 110 may generate a sense amplification enable signal SAEN that is enabled in response to the active signal ACT and disabled in response to the precharge signal PCG. The pull-up control unit 120 may generate the first pull-up control signal SAP1 and the second pull-up control signal SAP2 based on the sense amplification enable signal SAEN and delay the enabling timing of the first pull-up control signal SAP1 in response to the detection signal VSP_DET. According to an embodiment of the present invention, the pull-up control unit 120 may delay the enabling timing of the first pull-up control signal SAP1 when the detection signal VSP_DET is enabled. The pull-down control unit 130 may generate the pull-down control signal SAN based on the sense amplification enable signal SAE, and delay the enabling timing of the pull-down control signal SAN in response to the detection signal VSP_DET. According to an embodiment of the present invention, the pull-down control unit 130 may delay the enabling timing of the pull-down control signal SAN when the detection signal VSP_DET is disabled.

The voltage supplier 200 may include a first pull-up driving unit 210, a second pull-up driving unit 220, and a pull-down driving unit 230.

The first pull-up driving unit 210 may supply the power supply voltage VDD as the pull-up driving voltage through the pull-up power supply line RTO in response to the first pull-up control signal SAP1. According to an embodiment of the present invention, the first pull-up driving unit 210 may include a first transistor M1 that is coupled between a power supply voltage VDD terminal and the pull-up power supply line RTO, and receives the first pull-up control signal SAP1 through a gate. The second pull-up driving unit 220 may supply the core voltage VCORE as the pull-up driving voltage through the pull-up power supply line RTO in response to the second pull-up control signal SAP2. According to an embodiment of the present invention, the second pull-up driving unit 220 may include a second transistor M2 that is coupled between a core voltage VCORE terminal and the pull-up power supply line RTO, and receives the second pull-up control signal SAP2 through a gate. The pull-down driving unit 230 may supply the ground voltage VSS as the pull-down driving voltage through the pull-down power supply line SB in response to the pull-down control signal SAN. According to an embodiment of the present invention, the pull-down driving unit 230 may include a third transistor M3 that is coupled between the pull-down power supply line SB and a ground voltage VSS terminal, and receives the pull-down control signal SAN through a gate.

Additionally, the voltage supplier 200 may further include a precharge unit 240 for precharging the pull-up power supply line RTO and the pull-down power supply line SB with a bit line precharge voltage VBLP in response to an equalization signal BLEQ The voltage level of the bit line precharge voltage VBLP may be half of the voltage level of the core voltage VCORE (VCORE/2). According to an embodiment of the present invention, the precharge unit 240 may include a fourth transistor M4 that is coupled between a bit line precharge voltage VBLP terminal and the pull-up power supply line RTO, a fifth transistor M5 that is coupled between the bit line precharge voltage VBLP terminal and the pull-down power supply line SB, and a sixth transistor M6 that is coupled between the pull-up power supply line RTO and the pull-down power supply line SB. The fourth to sixth transistors M4 to M6 may receive the equalization signal BLEQ through gates, respectively.

As described the semiconductor memory device in accordance with the embodiment of the present invention may detect the voltage level of the power supply voltage VDD, which is the external voltage, and control the enabling timing of the first pull-up control signal SAP1 or the pull-down control signal SAN based on the detected voltage level. In short, the offset of the bit-line sense amplifier 300 may be optimized by controlling the turn-on timing of the first pull-up driving unit 210 and the pull-down driving unit 230 that supplies the pull-up driving voltage and the pull-down driving voltage, respectively, to the bit-line sense amplifier 300. As the offset of the bit-line sense amplifier 300 is optimized, a data of a memory cell MC with a small amount of charges may be sensed and amplified. Therefore, the semiconductor memory device may decrease the refresh rate and current consumption thereof.

Figure 4:
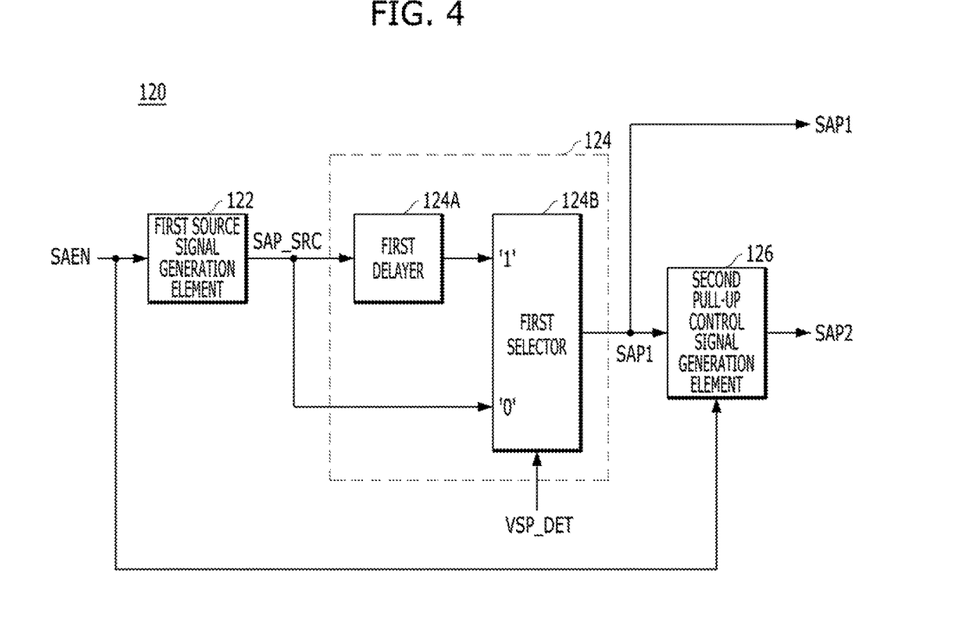
FIG. 4 is a block diagram illustrating an internal structure of a pull-up control unit shown in FIG. 3.

FIG. 4 is a block diagram illustrating an internal structure of the pull-up control unit 120 shown in FIG. 3.

Referring to FIG. 4, the pull-up control unit 120 may include a first source signal generation element 122, a first pull-up control signal generation element 124, and a second pull-up control signal generation element 126.

The first source signal generation element 122 may receive the sense amplification enable signal SAEN and generate a pull-up source signal SAP_SRC that is enabled in a predetermined initial section. According to an embodiment of the present invention, the first source signal generation element 122 may include a delayer (not shown) for delaying the sense amplification enable signal SAEN by a predetermined time.

The first pull-up control signal generation element 124 may generate the first pull-up control signal SAP1 in response to the pull-up source signal SAP_SRC, and delay the enabling timing of the first pull-up control signal SAP1 in response to the detection signal VSP_DET. The first pull-up control signal generation element 124 may generate the first pull-up control signal SAP1 to have the same pulse width as the pulse width of the pull-up source signal SAP_SRC.

The second pull-up control signal generation element 126 may receive the first pull-up control signal SAP1 and the sense amplification enable signal SAEN and generate the second pull-up control signal SAP2. The second pull-up control signal generation element 126 may generate the second pull-up control signal SAP2 that is enabled in response to the disabling of the first pull-up control signal SAP1 and disabled in response to the disabling of the sense amplification enable signal SAEN.

The first pull-up control signal generation element 124 may include a first delayer 124A that delays the pull-up source signal SAP_SRC by a first delay time D1 and a first selector 124B that selects the pull-up source signal SAP_SRC or an output of the first delayer 124A in response to the detection signal VSP_DET and outputs the selected one as the first pull-up control signal SAP1. According to an embodiment of the present invention, the first selector 1246 may select the output of the first delayer 124A when the detection signal VSP_DET is enabled, and when the detection signal VSP_DET is disabled, the first selector 1246 may select the pull-up source signal SAP _SRC.

Therefore, the pull-up control unit 120 may generate the first pull-up control signal SAP1 and the second pull-up control signal SAP2 based on the sense amplification enable signal SAEN. When the voltage level of the power supply voltage VDD is equal to or higher than the reference voltage VREF and the detection signal VSP_DET is enabled, the pull-up control unit 120 may delay the enabling timing of the first pull-up control signal SAP1 and output it. The pull-up control unit 120 may generate the second pull-up control signal SAP2 in response to the delayed first pull-up control signal SAP1.

Figure 5:
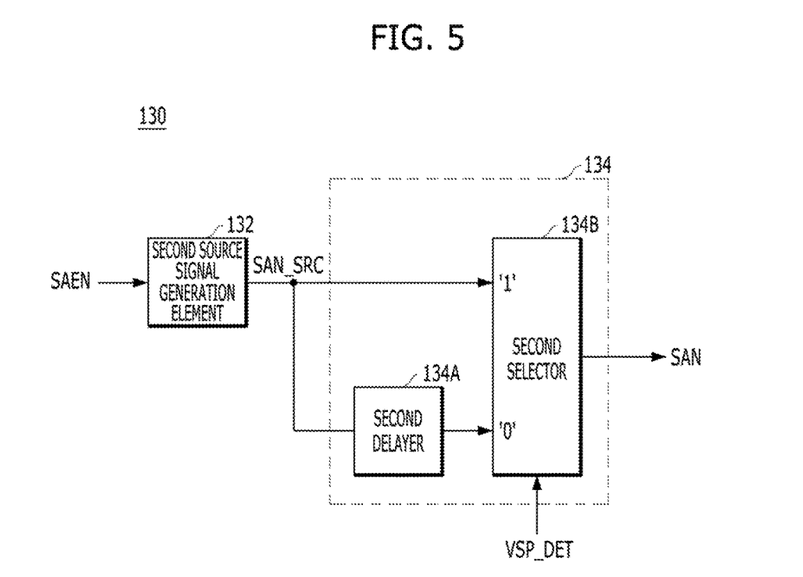
FIG. 5 is a block diagram illustrating an internal structure of a pull-down control unit shown in FIG. 3.

FIG. 5 is a block diagram illustrating an internal structure of the pull-down control unit 130 shown in FIG. 3.

Referring to FIG. 5, the pull-down control unit 130 may include a second source signal generation element 132 and a pull-down control signal generation element 134.

The second source signal generation element 132 may receive the sense amplification enable signal SAEN and generate a pull-down source signal SAN_SRC. According to an embodiment of the present invention, the second source signal generation element 132 may include a delayer (not shown for delaying the sense amplification enable signal SAEN by a predetermined time.

The pull-down control signal generation element 134 may generate the pull-down control signal SAN in response to the pull-down source signal SAN_SRC, and delay the enabling timing of the pull-down control signal SAN in response to the detection signal VSP_DET.

The pull-down control signal generation element 134 may include a second delayer 134A that delays the pull-down source signal SAN_SRC by a second delay time D2 and a second selector 134B that selects the pull-down source signal SAN_SRC or an output of the second delayer 134A in response to the detection signal VSP_DET and outputs the selected signal as the pull-down control signal SAN. According to an embodiment of the present invention, the second selector 1346 may select the output of the second delayer 134A when the detection signal VSP_DET is disabled, and when the detection signal VSP_DET is enabled, the second selector 1346 may select the pull-down source signal SAN_SRC.

Therefore, the pull-down control unit 130 may generate the pull-down control signal SAN based on the sense amplification enable signal SAEN. When the voltage level of the power supply voltage VDD is lower than the reference voltage VREF and the detection signal VSP_DET is disabled, the pull-down control unit 130 may delay the enabling timing of the pull-down control signal SAN and output it.

Hereafter, a method for driving the semiconductor memory device in accordance with the embodiment of the present invention is described with reference to the accompanying drawing.

Figure 6:
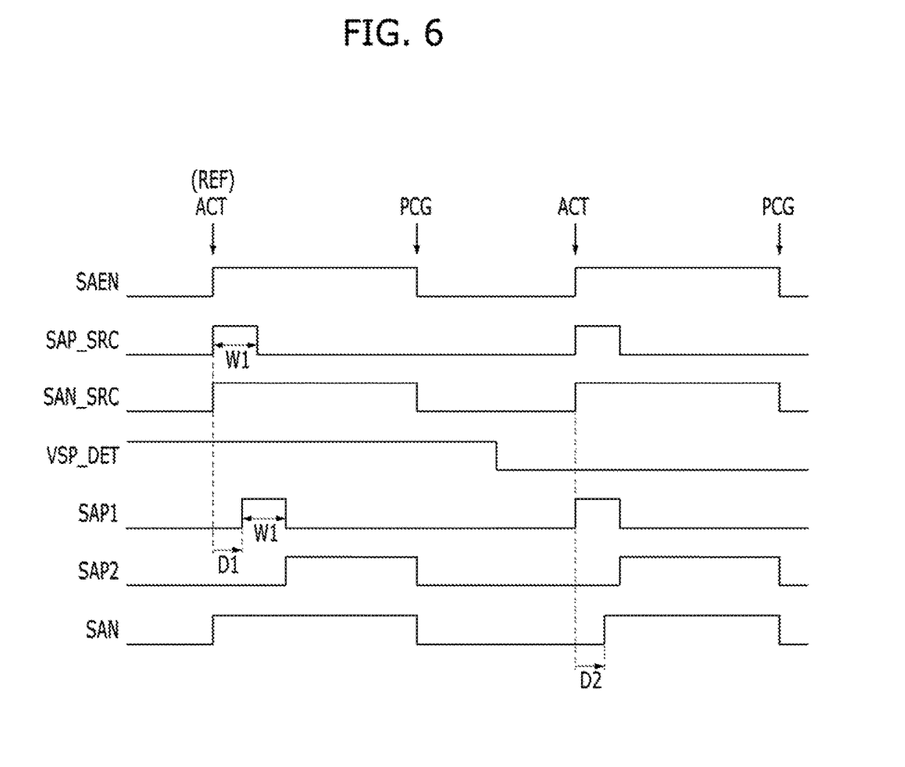
FIG. 6 is an operation waveform diagram of the semiconductor memory device shown in FIG. 3.

FIG. 6 is an operation waveform diagram of the semiconductor memory device shown in FIG. 3.

Before an active command is inputted to the semiconductor memory device, the bit line pair BL and BLB is precharged with the bit line precharge voltage VBLD.

When the active command or a refresh command REF is inputted to the semiconductor memory device, the active signal ACT may be generated internally. The word line WL may be activated in response to the active signal ACT, and the data of the memory cell MC coupled to the activated word line WL may be transferred to the bit line BL.

The enable signal generation unit 110 of the control signal generator 100 may generate the sense amplification enable signal SAEN that is enabled ill response to the active signal ACT and disabled in response to the precharge signal PCG. The first source signal generation element 122 of the pull-up control unit 120 may receive the sense amplification enable signal SAEN and generate the pull-up source signal SAP_SRC that is enabled during the predetermined initial section. The second source signal generation element 132 of the pull-down control unit 130 may receive the sense amplification enable signal SAEN and generate the pull-down source signal SAN_SRC.

The voltage detector 400 may detect the voltage level of the power supply voltage VDD and output the detection signal VSP_DET, A case in which the detection signal VSP_DET is enabled when the voltage level of the power supply voltage VDD is equal to or higher than the reference voltage VREF will now be described.

The first pull-up control signal generation element 124 may generate the first pull-up control signal SAP1 in response to the pull-up source signal SAP_SRC. The first pull-up control signal generation element 124 may delay the pull-up source signal SAP_SRC and output the delayed signal as the first pull-up control signal SAP1 in response to the enabled detection signal VSP_DET. Additionally, the first pull-up control signal generation element 124 may secure a time for an over-driving operation by generating the first pull-up control signal SAP1 to have the same pulse width W1 as the pulse width W1 of the pull-up source signal SAP_SRC.

The second pull-up control signal generation element 126 may generate the second pull-up control signal SAP2 that is enabled in response to the disabling of the first pull-up control signal SAP1 and disabled in response to the disabling of the sense amplification enable signal SAEN. Since the enabling timing of the first pull-up control signal SAP1 is delayed while maintaining the pulse width W1 thereof, the pulse width of the second pull-up control signal SAP2 may be decreased. However, since the pulse width of the second pull-up control signal SAP2 is considerably greater as compared with the pulse width W1 of the first pull-up control signal SAP1 the decrease in the pulse width of the second pull-up control signal SAP2 scarcely affects the overall sense amplification operation, Moreover, the pull-down control signal generation element 134 may generate the pull-down control signal SAN in response to the pull-down source signal SAN_SRC. The pull-down control signal generation element 134 may output the pull-down source signal SAN_SRC as the pull-down control signal SAN without a delay in response to the enabled detection signal VSP_DET.

Therefore, if the detection signal VSP_DET is enabled when the voltage level of the power supply voltage VDD is equal to or higher than the reference voltage VREF, the control signal generator 100 may delay the enabling timing of the first pull-up control signal SAP1. Accordingly, the voltage supplier 200 may supply the ground voltage VSS through the pull-down power supply line SB ahead of the timing for supplying the power supply voltage VDD through the pull-up power supply line RTO. Therefore, since it is possible to delay obtaining the gate-source voltage Vgs and turning-on of the PMOS transistor pair PM1 and PM2 of the bit-line sense amplifier 300, the influence of the PMOS transistor pair PM1 and PM2 on the offset of the bit-line sense amplifier 300 may be minimized, thus optimizing the offset.

Hereafter, a case in which the detection signal VSP_DET is disabled due to the voltage level of the power supply voltage VDD being lower than the reference voltage VREF is described.

The first pull-up control signal generation element 124 may generate the first pull-up control signal SAP1 in response to the pull-up source signal SAP_SRC. The first pull-up control signal generation element 124 may output the pull-up source signal SAP_SRC as the first pull-up control signal SAP1 without a delay in response to the disabled detection signal VSP_DET. The second pull-up control signal generation element 126 may generate the second pull-up control signal SAP2 that is enabled in response to the disabling of the first pull-up control signal SAP1 and disabled in response to the disabling of the sense amplification enable signal SAEN. Moreover, the pull-down control signal generation element 134 may generate the pull-down control signal SAN in response to the pull-down source signal SAN_SRC. The pull-down control signal generation element 134 may delay the enabling timing of the pull-down source signal SAN_SRC to output the pull-down control signal SAN in response to the disabled detection signal VSP_DET.

Therefore, if the detection signal VSP_DET is disabled when the voltage level of the power supply voltage VDD is lower than the reference voltage VREF the control signal generator 100 may delay the enabling timing of the pull-down control signal SAN. Accordingly, the voltage supplier 200 may supply the power supply voltage VDD through the pull-up power supply line RTO ahead of the timing for supplying the ground voltage VSS through the pull-down power supply line SB. Therefore, since it is possible to delay the turn-on timing of the NMOS transistor pair NM1 and NM2, the influence of the NMOS transistor pair NM1 and NM2 on the offset of the bit-line sense amplifier 300 may be minimized, thus optimizing the offset.

The bit-line sense amplifier 300 may perform the over-driving operation by sensing and amplifying the data of the bit line pair BL and BLB with the pull-up driving voltage and the pull-down driving voltage that are respectively supplied through the pull-up power supply line RTO and the pull-down power supply line SB and then to perform a normal driving operation.

According to an embodiment of the present invention, it is described above that the enabling timing of the pull-down control signal SAN is delayed when the voltage level of the power supply voltage VDD is lower than the reference voltage VREF and the detection signal VSP_DET is disabled. However according to another embodiment of the present invention, the enabling timing of the pull-down control signal SAN may not be adjusted even though the detection signal VSP_DET is disabled. This is due to the mismatch of the NMOS transistor pair NM1 and NM2 having less influence on the offset of the bit-line sense amplifier 300 than the mismatch of the PMOS transistor pair PM1 and PM2.

Described hereafter are a structure of the semiconductor memory device and a method for operating the semiconductor memory device in accordance with another embodiment of the present invention.

Figure 7:
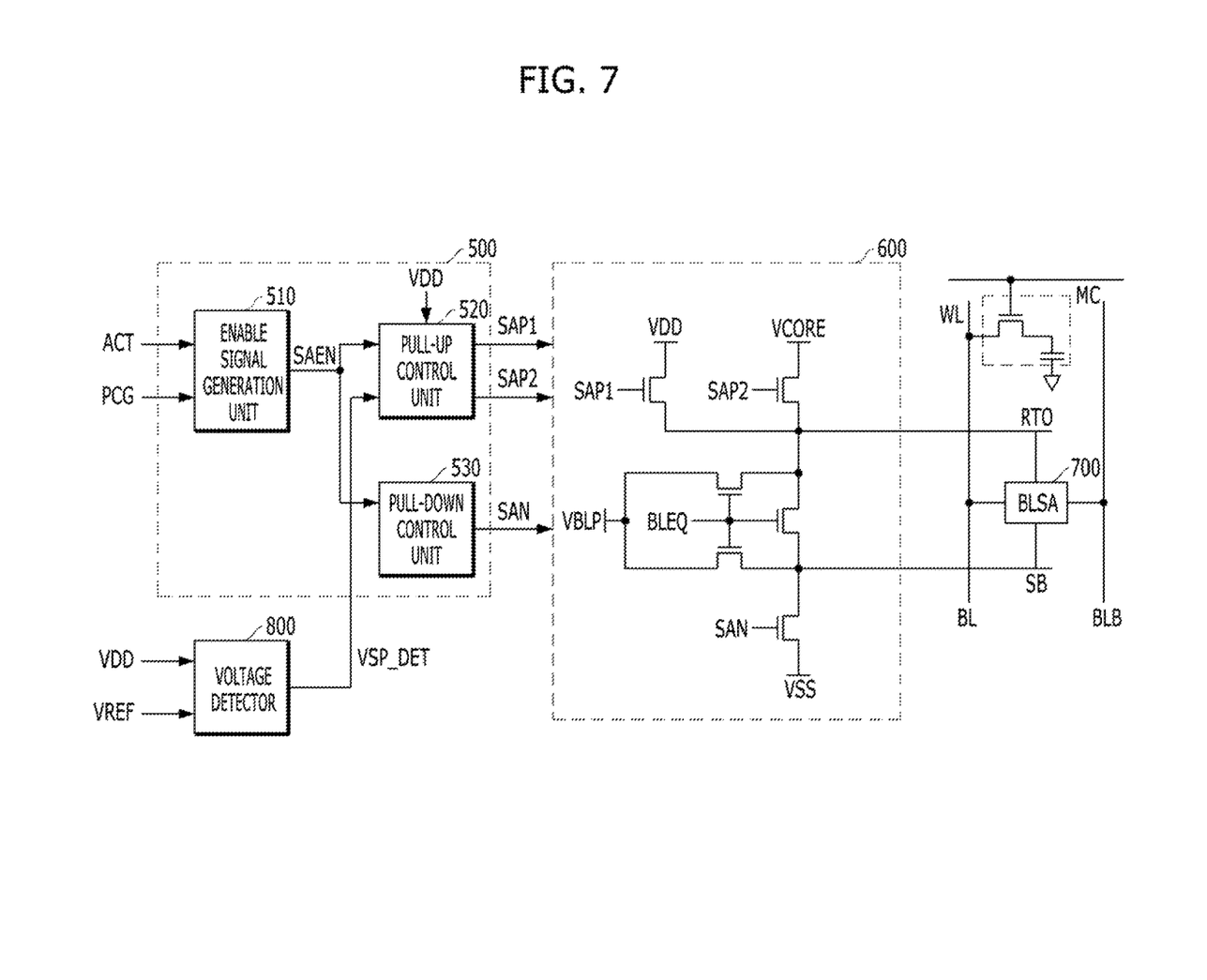
FIG. 7 is a block diagram illustrating a semiconductor memory device in accordance with another embodiment of the present invention.

FIG. 7 is a block diagram illustrating a semiconductor memory device according to another embodiment of the present invention.

Referring to FIG. 7, the semiconductor memory device may include a control signal generator 500, a voltage supplier 600, a bit-line sense amplifier 700, and a voltage detector 800. Since the semiconductor memory device shown in FIG. 7 includes constituent elements substantially the same as those shown in FIG. 3, a description of different constituent elements in FIG. 7 and FIG. 3 is only made herein.

The control signal generator 500 may include an enable signal generation unit 510, a pull-up control unit 520, and pull-down control unit 530. Whereas the pull-down control unit 130 of FIG. 3 receives the detection signal VSP_DET and delays the enabling timing of the pull-down control signal SAN, the pull-down control unit 530 of FIG. 7 is not affected by the detection signal VSP_DET. Moreover, while the pull-up control unit 120 of FIG. 3 delays only the enabling timing of the first pull-up control signal SAP1 based on the detection signal VSP_DET, the pull-up control unit 520 of FIG. 7 may not only delay the enabling timing of the first pull-up control signal SAP1 but also adjusts the delay amount of the enabling timing of the first pull-up control signal SAP1.

The enable signal generation unit 510 may generate a sense amplification enable signal SAEN that is enabled in response to an active signal ACT and disabled in response to a precharge signal PCG. The pull-up control unit 520 may generate a first pull-up control signal SAP1 and a second pull-up control signal SAP2 based on the sense amplification enable signal SAEN. The pull-up control unit 520 may delay the enabling timing of the first pull-up control signal SAP1 by adjusting a delay amount in response to the detection signal VSP_DET. Herein, the pulse width of the first pull-up control signal SAP1 may be decreased, compared with the pulse width of the pull-up source signal SAP_SRC. The pull-down control unit 530 may generate a pull-down control signal SAN based on the sense amplification enable signal SAEN.

Figure 8:
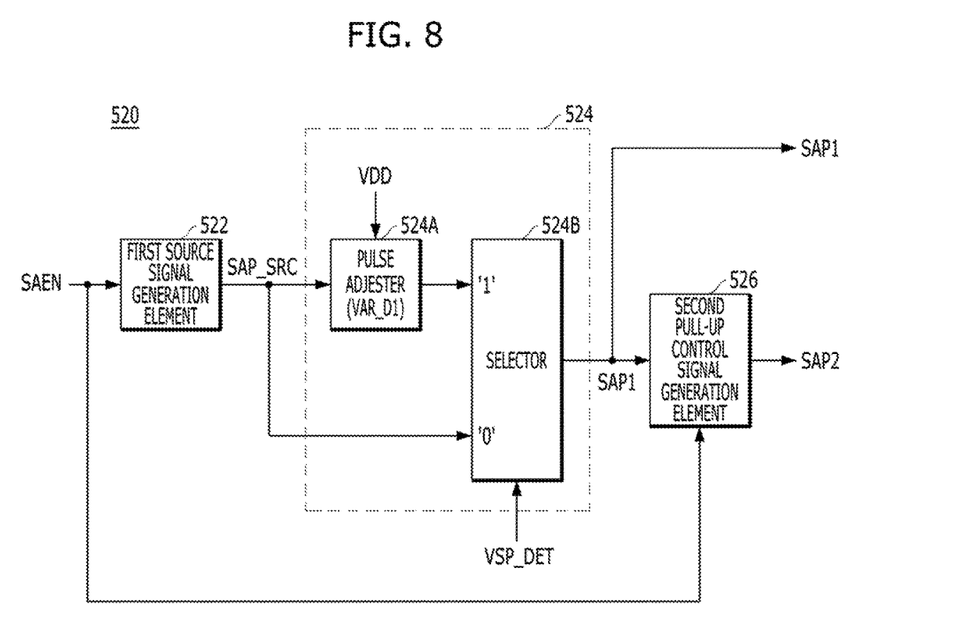
FIG. 8 is a block diagram illustrating an internal structure of a pull-up control unit shown in FIG. 7.

FIG. 8 is a block diagram illustrating an internal structure of the pull-up control unit 520 shown in FIG. 7.

Referring to FIG. 8, the pull-up control unit 520 may include a first source signal generation element 522, a first pull-up control signal generation element 524, and a second pull-up control signal generation element 526. Since the pull-up control unit 520 shown in FIG. 8 includes constituent elements substantially the same as those shown in FIG. 4, a description of different constituent elements in FIG. 8 and FIG. 4 is only made herein.

The first pull-up control signal generation element 524 may generate the first pull-up control signal SAP1 in response to a pull-up source signal SAP_SRC, and delay the enabling timing of the first pull-up control signal SAP1 in response to the detection signal VSP_DET. Herein, the first pull-up control signal generation element 524 may also be able to adjust the delay amount of the enabling timing of the first pull-up control signal SAP1 in response to the detection signal VSP_DET. Herein, the pulse width of the first pull-up control signal SAP1 may be decreased, compared with the pulse width of the pull-up source signal SAP_SRC.

The first pull-up control signal generation element 524 may include a pulse adjuster 524A that delays a rising edge of the pull-up source signal SAP_SRC by a first variable delay time VAR_D1 which varies based on the voltage level of the power supply voltage VDD, and a selector 524B that selects the pull-up source signal SA_SRC or an output of the pulse adjuster 524A in response to the detection signal VSP_DET and outputs the selected one as the first pull-up control signal SAP1.

According to an embodiment of the present invention, the pulse adjuster 524A may include a plurality of inverters (not shown) that are coupled. Each of the inverters does riot receive an internal voltage, such as a core voltage VCORE or an internal power supply voltage VDDI, but receives the external power supply voltage VDD as a driving voltage. Therefore, the pulse adjuster 524A may have the first variable delay time VAR_D1 which varies based on the voltage level of the power supply voltage VDD as its delay amount. The selector 524B may select the output of the pulse adjuster 524A when the detection signal VSP_DET is enabled, and when the detection signal VSP_DET is disabled the selector 524B may select the pull-up source signal SAP_SRC.

Therefore, the pull-up control unit 520 may generate the first pull-up control signal SAP1 and the second pull-up control signal SAP2 based on the sense amplification enable signal SAEN. When the voltage level of the power supply voltage VDD is equal to or higher than the reference voltage VREF and the detection signal VSP_DET is enabled, the pull-up control unit 520 may delay the enabling timing of the first pull-up control signal SAP1, while adjusting a delay amount of the enabling timing of the first pull-up control signal SAP1 based on the voltage level of the power supply voltage VDD.

According to an embodiment of the present invention, the voltage detector 800 of FIG. 7 may generate only the detection signal VSP_DET when the voltage level, of the power supply voltage VDD is equal to or higher than the reference voltage VREF. However, according to another embodiment of the present invention, the voltage detector may generate not only the detection signal VSP_DET but also a variation detection signal VSP_DELTA (not shown) which represents the difference value between the voltage levels of the power supply voltage VDD and the reference voltage VREF. The variation detection signal VSP_DELTA (not shown) may be inputted to the pulse adjuster 524A of the pull-up control unit 520 to be used for adjusting the delay amount of the pulse adjuster 524A.

Figure 9:
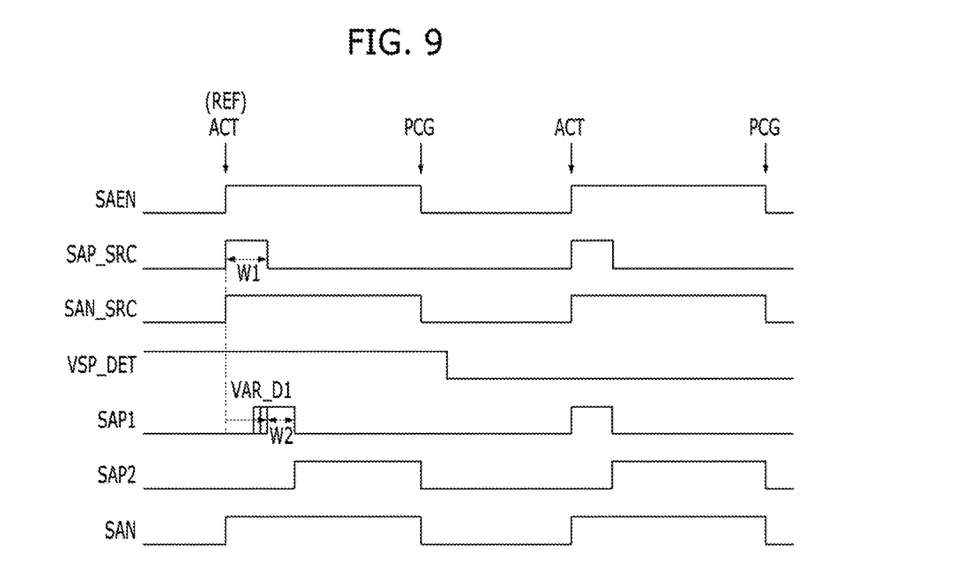
FIG. 9 is an operation waveform diagram o the semiconductor memory device shown in FIG. 7.

FIG. 9 is an operation waveform diagram of the semiconductor memory device shown in FIG. 7.

Before an active command is inputted to the semiconductor memory device, the bit line pair BL and BLB is precharged with a bit line precharge voltage VBLP.

When the active command or a refresh command REF is inputted to the semiconductor memory device, the active signal ACT may be generated internally. A word line WL may be activated in response to the active signal ACT, and the data of a memory cell MC coupled to the activated word line WL may be transferred to a bit line BL.

The enable signal generation unit 510 of the control signal generator 500 may generate the sense amplification enable signal SAEN that is enabled in response to the active signal ACT and disabled in response to the precharge signal PCG. The first source signal generation element 522 of the pull-up control unit 520 may receive the sense amplification enable signal SAEN and generate the pull-up source signal SAP_SRC that is enabled during the predetermined initial section. A second source signal generation element (not shown) of the pull-down control unit 530 may receive the sense amplification enable signal SAEN and generate a pull-down source signal SAN_SRC.

The voltage detector 800 may detect the voltage level of the power supply voltage VDD and output the detection signal VSP_DET.

A case in which the detection signal VSP_DET is enabled when the voltage level of the power supply voltage VDD is equal to or higher than the reference voltage VREF will now be described.

The first pull-up control signal generation element 524 may generate the first pull-up control signal SAP1 in response to the pull-up source signal SAP_SRC. The first pull-up control signal generation element 524 may delay the pull-up source signal SAP_SRC and output the delayed signal as the first pull-up control signal SAP1 in response to the enabled detection signal VSP_DET, while adjusting the delay amount VAR_D1 of the pull-up source signal SAP_SRC. Herein, the pulse width W2 of the first pull-up control signal SAP1 may be decreased, compared with the pulse width W1 of the pull-up source signal SAP_SRC (W1>W2).

The second pull-up control signal generation element 526 may generate the second pull-up control signal SAP2 that is enabled in response to the disabling of the first pull-up control signal SAP1 and disabled in response to the disabling of the sense amplification enable signal SAEN. The pull-down control unit 530 may generate the pull-down control signal SAN in response to the pull-down source signal SAN_SRC.

Therefore, if the detection signal VSP_DET is disabled when the voltage level of the power supply voltage VDD is equal to or higher than the reference voltage VREF, the control signal generator 500 may delay the enabling timing of the first pull-up control signal SAP1. Accordingly, the voltage supplier 600 may supply the ground voltage VSS through the pull-down power supply line SB ahead of the timing for supplying the power supply voltage VDD through the pull-up power supply line RTO. Therefore, since it is possible to delay the turn-on timing of a PMOS transistor pair PM1 and PM2 of the bit-line sense amplifier 700, the influence of the PMOS transistor pair PM1 and PM2 on the offset of the bit-line sense amplifier 700 may be minimized, thus optimizing the offset.

Hereafter, a case in which the detection signal VSP_DET is disabled due to the voltage level of the power supply voltage VDD being lower than the reference voltage VREF is described.

The first pull-up control signal generation element 524 may generate the first pull-up control signal SAP1 in response to the pull-up source signal SAP_SRC. The first pull-up control signal generation element 524 may output the pull-up source signal SAP_SRC as the first pull-up control signal SAP without a delay in response to the disabled detection signal VSP_DET. The second pull-up control signal generation element 526 may generate the second pull-up control signal SAP2 that is enabled in response to the disabling of the first pull-up control signal SAP1 and disabled in response to the disabling of the sense amplification enable signal SAEN. The pull-down control unit 530 may output the pull-down control signal SAN.

The bit-line sense amplifier 700 may perform the over-driving operation by sensing and amplifying the data of the bit line pair BL and BLB with the pull-up driving voltage and the pull-down driving voltage that are respectively supplied through the pull-up power supply line RTO and the pull-down power supply line SB and then perform a normal driving operation.

According to the embodiment of the present invention, a semiconductor memory device may have an improved data retention time of memory cells by optimizing the offset of a bit-line sense amplifier circuit. As a result, the semiconductor memory device may decrease the refresh rate of a refresh operation.

According to the embodiment of the present invention, a semiconductor memory device may reduce the amount of current consumed for a refresh operation by improving the data retention time of memory cells.

While, the present invention has been described with respect to the specific embodiments it will be apparent to those skilled in the art that various changes and modifications may be made without departing from the spirit and scope of the invention as defined in the following claims. For example, the positions and kinds of logic gates and transistors described in the above-described embodiments of the present invention may be realized differently according to the polarity of an input signal.

What is claimed is:

1. A voltage supplying circuit comprising:
   a first pull-up driving unit suitable for supplying a power supply voltage as a pull-up driving voltage through a pull-up power supply line in response to a first pull-up control signal;
   a second pull-up driving unit suitable for supplying an internal voltage lower than the power supply voltage as the pull-up driving voltage through the pull-up power supply line in response to a second pull-up control signal;
   a pull-down driving unit suitable for supplying a ground voltage as a pull-down driving voltage through a pull-down power supply line in response to a pull-down control signal; and
   a control signal generation unit suitable for generating the first pull-up control signal, the second pull-up control signal, and the pull-down control signal and delaying an enabling timing of one of the first pull-up control signal and the pull-down control signal in response to a detection signal that is enabled when the voltage level of the power supply voltage reaches a predetermined level.

2. The voltage supplying circuit of claim 1,
   wherein when the detection signal is enabled, the control signal generation unit delays the enabling timing of the first pull-up control signal, and
   wherein when the detection signal is disabled, the control signal generation unit further delays an enabling timing of the pull-down control signal.

3. The voltage supplying circuit of claim 1, wherein when the detection signal is enabled, the control signal generation unit delays the enabling timing of the first pull-up control signal by adjusting a delay amount of the enabling timing of the first pull-up control signal based on the voltage level of the power supply voltage.

4. The voltage supplying circuit of claim 1, wherein the control signal generation unit includes:
   an enable signal generation unit suitable for generating an enable signal that is enabled in response to an active signal and disabled in response to a precharge signal;
   a pull-up control unit suitable for generating the first pull-up control signal and the second pull-up control signal based on the enable signal by delaying the enabling timing of the first pull-up control signal in response to the detection signal; and
   a pull-down control unit suitable for generating the pull-down control signal based on the enable signal by delaying an enabling timing of the pull-down control signal in response to the detection signal.

5. The voltage supplying circuit of claim 1, wherein the control signal generation unit includes:
   an enable signal generation unit suitable for generating an enable signal that is enabled in response to an active signal and disabled in response to a precharge signal;
   a pull-up control unit suitable for generating the first pull-up control signal and the second pull-up control signal based on the enable signal by delaying the enabling timing of the first pull-up control signal in response to the detection signal and adjusting a delay amount of the enabling timing of the first pull-up control signal based on the voltage level of the power supply voltage; and
   a pull-down control unit suitable for generating the pull-down control signal based on the enable signal.

6. An operating method of semiconductor memory device, comprising:
   generating a first pull-up control signal, a second pull-up control signal, and a pull-down control signal, in response to an active signal and a precharge signal, by delaying an enabling timing of the first pull-up control signal based on a voltage level of a power supply voltage;
   supplying the power supply voltage through a pull-up power supply line in response to the first pull-up control signal, supplying an internal voltage lower than the power supply voltage through the pull-up power supply line in response to the second pull-up control signal, and supplying a ground voltage through a pull-down power supply line in response to the pull-down control signal; and
   sensing and amplifying data of a bit line pair with a pull-up driving voltage that is supplied through the pull-up power supply line and a pull-down driving voltage that is supplied through the pull-down power supply line.

7. The operating method of claim 6, wherein the generating of the first pull-up control signal, the second pull-up control signal, and the pull-down control signal in response to the active signal and the precharge signal by the delaying of the enabling timing of the first pull-up control signal based on the voltage level of the power supply voltage includes:
   delaying the enabling timing of the first pull-up control signal when the voltage level of the power supply voltage is equal to or higher than a reference voltage; and
   further delaying an enabling timing of the pull-down control signal when the voltage level of the power supply voltage is lower than the reference voltage.

8. The operating method of claim 6, wherein the generating of the first pull-up control signal, the second pull-up control signal, and the pull-down control signal in response to the active signal and the precharge signal, by the delaying of the enabling timing of the first pull-up control signal based on the voltage level of the power supply voltage includes:
   delaying the enabling timing of the first pull-up control signal and adjusting a delay amount of the enabling timing of the first pull-up control signal based on the voltage level of the power supply voltage, when the voltage level of the power supply voltage is equal to or higher than the reference voltage.

9. The operating method of claim 6, wherein the generating of the first pull-up control signal, the second pull-up control signal, and the pull-down control signal in response to the active signal and the precharge signal, by the delaying of the enabling timing of the first pull-up control signal based on the voltage level of the power supply voltage includes:
   enabling a detection signal when the voltage level of the power supply voltage is equal to or higher than the reference voltage;
   enabling and disabling the pull-down control signal in response to the active signal and the precharge signal, respectively, by delaying an enabling timing of the pull-down control signal in response to a disabling of the detection signal;
   enabling and maintaining the first pull-up control signal in a predetermined section in response to the active signal, by delaying the enabling timing of the first pull-up control signal in response to an enabling of the detection signal; and
   enabling and disabling the second pull-up control signal in response to a disabling of the first pull-up control signal and the precharge signal, respectively.

* * * * *